United States Patent [19]

Asakawa

[11] Patent Number: 4,555,650

[45] Date of Patent: Nov. 26, 1985

[54] TWO DIMENSIONAL DRIVING DEVICE FOR USE IN A POSITIONING DEVICE IN A SEMICONDUCTOR MANUFACTURING APPARATUS

[75] Inventor: Teruo Asakawa, Nirasaki, Japan

[73] Assignee: Telmec Co., Ltd., Nirasaki, Japan

[21] Appl. No.: 481,737

[22] Filed: Apr. 4, 1983

[30] Foreign Application Priority Data

Apr. 7, 1982 [JP] Japan .................................. 57-57848

[51] Int. Cl.$^4$ ........................................... H02K 41/00
[52] U.S. Cl. .................................... 318/135; 318/574; 318/575; 318/603; 310/12
[58] Field of Search ............... 318/135, 575, 600, 603, 318/569, 574, 115; 310/46, 12

[56] References Cited

U.S. PATENT DOCUMENTS 3,376,578  4/1968  Sawyer ........................... 318/135 X
3,878,411  4/1975  Nocito et al. .................... 318/135 X
4,187,453  2/1980  Rough ............................. 310/46 X

OTHER PUBLICATIONS

Proceedings of the 4th Intersociety Energy Conversion Engineering Conference, Washington, D.C., USA, 22–26, Sep. 1969.

Conference: Proceedings of Southeastcon, Roanoke, Va, USA, 1–4, Apr. 1979.

*Primary Examiner*—B. Dobeck
*Assistant Examiner*—Bentsu Ro
*Attorney, Agent, or Firm*—Price, Heneveld Huizenga & Cooper

[57] ABSTRACT

A device for positioning a semiconductor substrate is provided comprising magnetic field group formed from a plurality of magnetic fields disposed on a plane in a two-dimensional array. The magnetic fields are provided with a perpendicular orientation relative to the plane and adjacent magnetic fields are directed in alternate directions. Coil sets are formed of a plurality of coils, the coils having a specific dimensional relationship with the magnetic field array. Coil groups are formed by fixedly securing a plurality of these coil sets to each other the coil groups being disposed within the magnetic field group so as to be freely movable along the plane. Electric current is applied to the coils which generates a force in each coil set so as to move the coil set in either one of the longitudinal and lateral directions of the array of magnetic fields, whereby a current-motion converter and a driving device making use of the converter can be formed.

5 Claims, 11 Drawing Figures

TWO DIMENSIONAL DRIVING DEVICE FOR USE IN A POSITIONING DEVICE IN A SEMICONDUCTOR MANUFACTURING APPARATUS

BACKGROUND OF THE INVENTION

The present invention relates to a novel driving device consisting of a stator and an armature which can be moved in two dimensions along the stator, and to a two-dimensional driving device used as a positioning device in a semiconductor manufacturing process.

Heretofore, in positioning devices used in semiconductor manufacturing apparatus, generally a loading table is adapted to be moved each time by a microfine distance, and as driving means for the loading table a step motor or a rotary type D.C. servo motor is used. In general the rotary motion of the servo motor is converted to linear motion by a feed screw or the like. However, in view of the structure of the prior art apparatus it is difficult to give a fine movement of 1 micron or less to the loading table, and if it is intended to obtain a high resolution, generally the moving speed becomes slow due to the fact that a pitch of a screw becomes fine. Therefore, in many examples a loading table is formed in a double structure having a separate structure for providing a fine displacement. Hence, the device becomes mechanically complex, and expensive. On the other hand, there have been recent developments in D.C. linear motors and good results have been obtained both in obtaining high resolution of 1 micron or less and in high speed feeding using linear motors. However, both the method relying upon screw feed and the method employing a linear motor can give only a linear motion to a loading table. Nevertheless, generally in many cases a loading table must achieve two dimensional motion along a plane, and therefore, it has been a common practice to form an X-Y orthogonal coordinate system by making use of two linear drive sources which are perpendicular to each other and guide rails for restraining movements in the direction other than the driving directions.

The inventor of this invention previously invented a novel driving device for resolving the above-mentioned problem, and also invented a positioning device making use of the driving device. A Japanese patent application for the invention is pending at the Japanese Patent Office as Patent Application No. 56344/1982 and is also filed at the U.S. Patent Office claiming a Convention Priority. The U.S. application was filed on Apr. 1, 1983, Ser. No. 481,324, entitled Two-Dimensional Precise Positioning Device for Use in a Semiconductor Manufacturing Apparatus and has a common assignee.

According to this prior invention, a novel driving device which was not found in the past can be provided, and by making use of this driving device a high speed and precise positioning device can be provided without relying upon a double structure or guide rails.

However, in the device according to the prior invention, a control circuit for controlling the device becomes complex, and hence manufacture and handling of the device are troublesome.

The present invention improves the aforementioned prior invention, and it is one object of the present invention to provide a novel current-motion converter in which a control method and a control circuit are relatively simple.

Another object of the present invention is to provide a driving device for use in a precision positioning device or the like by making use of the current-motion converter.

SUMMARY OF THE INVENTION

According to one feature of the present invention, there is provided a current-motion converter in which a magnetic field group is formed by disposing magnetic fields on a plane in a two-dimensional array with equal period of distribution of the magnetic field poles. Adjacent, magnetic poles in the array are alternately disposed. According to other aspects of the invention a first coil set for generating a force in one direction of the magnetic field is formed by fixedly securing a plurality of coils to each other either directly or indirectly. Similarly, a second coil set for generating a force in the other two-dimensional direction that is different from said one direction is formed. A coil group is then formed by fixedly securing said first and second coil sets to each other either directly or indirectly, and said coil group is disposed within said magnetic group so as to be freely movable along said plane.

BRIEF DESCRIPTION OF THE DRAWINGS

The above-mentioned and other features and objects of the present invention will become more apparent by reference to the following description of preferred embodiments of the invention taken in conjunction with the accompanying drawings, wherein.

DESCRIPTION OF THE PREFERRED EMBODIMENTS

Figure 10:
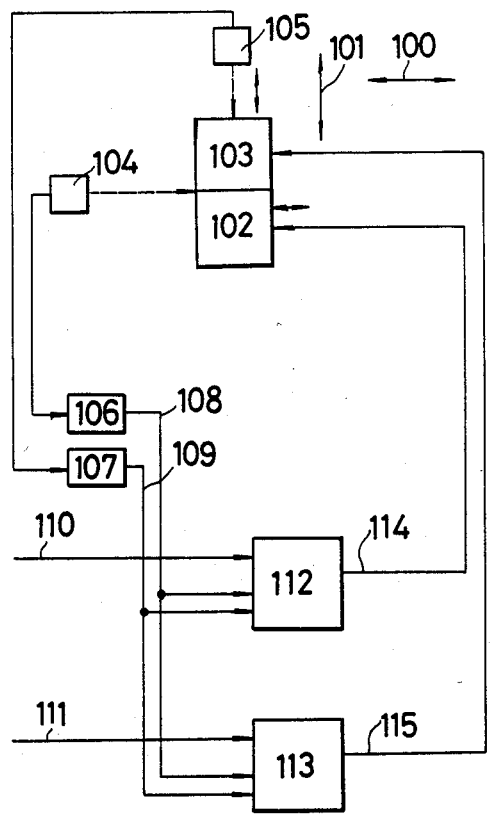
FIG. 10 is a block diagram showing an outline of a driving device.

In order to facilitate understanding of the present invention, the first description will be made on the driving device as a whole according to the present invention shown in FIG. 10.

Figure 11:
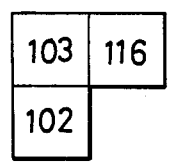
FIG. 11 is a block diagram showing a coil group formed of three coil sets.

Reference numerals 102 and 103 designate members forming a current-motion converter according to the present invention, and each of the members is a coil set consisting of a plurality of coils assembled in one set and is smoothly movable in a two-dimensional manner along a moving plane including arrows 100 and 101 within a common magnetic field not shown. The coil set 102 is constructed so as to generate a driving force directed in the directions of the arrows 100, while the coil set 103 is constructed so as to generate a driving force directed in the direcrtions of the arrows 101, the coil sets 102 and 103 are integrally jointed to form a coil group, and in combination with a magnetic field group not shown, they form a two-dimensional current-motion converter. Reference numerals 104 and 105 designate a two-dimensional ranging device for knowing the positions of an armature and it can be constructed of, for instance, a laser ranging device or a two-dimensional optical encoder. Reference numerals 106 and 107 designate counters for always registering the positions of the armature, which counters are always renewed in values by the outputs of the ranging devices 104 and 105. Accordingly, reference numerals 108 and 109 designate digital signals indicating the present position of the armature. Reference numerals 112 and 113 designate control circuits for the current-motion converter according to the present invention as will be described later. These control circuits distribute analog drive input signals in the direction of the arrows 100 and 101 denoted by reference numerals 110 and 111 to the respective coils forming the respective coil sets in a proper proportion as currents having proper magnitudes, and thereby output drive current signals 114 and 115 for generating forces proportional to the respective input signals 110 and 111. The thus formed driving device uses the magnetic field in common and comprises a coil group consisting of two coil sets for generating forces which are perpendicular to each other. However, as shown in FIG. 11 a coil group could be formed by further adding another coil set 116 to the above-mentioned coil group. This provides the ability to control or restrain the rotation of the coil group, and such a modified coil group can be used, as a matter of course, in the current-motion converter of the present invention.

In addition, in view of the fact that the direction of a force generated by a coil set is constant, a current-motion converter that is available as a linear motor can be provided by taking out only a part of the two-dimensionally arrayed magnetic field (aligned only in one direction) and by employing at least one coil set.

As described above, the driving device according to the present invention consists of a current-motion converter making use of a plurality of coil sets and a control circuit therefor. In the following, a first description will be made on the portion of the current-motion converter which is one component element of the driving device according to the present invention.

Figure 1:
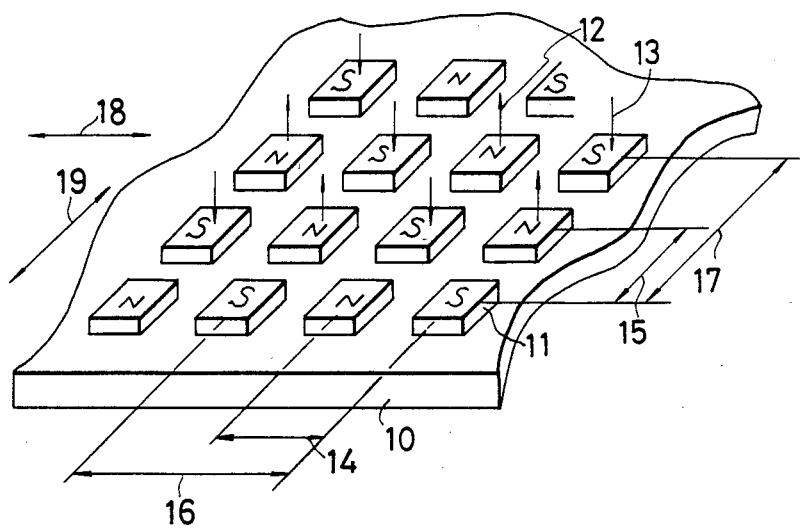
FIG. 1 is a perspective view of the portion of the magnetic field group in the current-motion converter according to the present invention.

The aforementioned current-motion converter makes use of a force exerted upon a current flowing through a conductor disposed in a magnetic field. A perspective view of an example of a magnetic field group portion of a current-motion converter according to the present invention, is shown in FIG. 1. In FIG. 1 reference numeral 10 designates a member forming a part of a magnetic path and holding permanent magnets. Reference numeral 11 designates permanent magnets which are magnetized in the directions of magnetic axes represented by arrows 12, and they are arrayed at equal intervals in the directions of arrows 18 and 19 and moreover with their N and S poles arrayed alternately. Accordingly, with regard to the directions of the magnetic fields the direction of an arrow 12 and the direction of an arrow 13 align alternately. Reference numerals 14 and 15 indicate intervals between the centers of magnetic fields directed in the directions of the arrows 18 and 19, respectively, and reference numerals 16 and 17 indicate the period of the array of the magnetic field along the directions represented by arrows 18 and 19, respectively.

It is to be noted that the plane including the arrows 18 and 19 is the plane of movement of an armature.

With regard to the construction for establishing the magnetic field group, so long as a similar magnetic field group can be established, the magnetic structure is not limited to the illustrated example. Furthermore, although the coil set or the coil group is considered as an armature and the magnetic field group is considered as a stator throughout this specification, the relation thereof could be reversed.

The characteristic feature of the current-motion converter constructed according to the present invention resides in the provision of an improved coil structure and provision of a simplified arrangement for controlling the motion of the coils. More specifically, control of the motion of the improved coil is simplified by virtue of the fact that independent coil sets can generate a force directed only in one direction of the directions of the array of the magnetic field.

Figure 2:
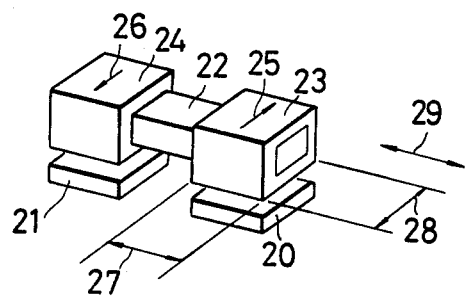
FIG. 2 is a perspective view of a coil set to be used in the same current-motion converter.

A perspective view of one example of the coil is shown in FIG. 2. Reference numeral 22 designates a member forming a part of a magnetic path and serving as a core of coils, and reference numerals 23 and 24 designate coils. In this example, two coils are combined to operate electrically as a single coil. However, in principle, either one coil is sufficient, and as a matter of course, three or more coils arrayed in a two-dimensional manner so as to fulfill the relation between the direction of an electric current and the direction of a force as will be described later, could be used in combination. The coils 23 and 24 are in a positional relationship in which they are displayed in parallel from each other by the distance between the centers of the magnetic fields in that direction, and the sizes 27 and 28 of the projections on the plane of displacement are nearly equal to ½ of the distance between the centers of the magnetic field in that direction. In addition, the coils 23 and 24 are connected to each other in such sense that when a current directed in the direction of an arrow 25 is passed through the coil 23, a current directed in the direction of an arrow 26 may be passed through the coil 24. Considering here the case where the two coils are placed respectively on the permanent magnets 20 and 21, then the positional relationship between the permanent magnets 20 and 21 and the coils 23 and 24 becomes as shown in FIG. 2, and since the directions of the magnetic fields are alternately reversed, the magnetic path closes from one of the magnets through the magnetic path forming member 22 to the other magnet. Accordingly, the windings of the coils 23 and 24 are placed always in the oppositely directed magnetic fields. However since the coil 23 and the coil 24 are connected so that current flow therethrough is always in opposite directions as described previously, according to the well-known electromagnetic theory, the directions of the forces exerted upon the coils 23 and 24 become equal as directed in the direction indicated by an arrow 29, and the magnitude of the force is proportioned to the current passed through the coils. However, if the position of the coil relative to the magnetic field is varied, then the intensity of the magnetic field penetrating through the coil changes, and so, the force exerted upon the coil is also varied.

Figure 3:
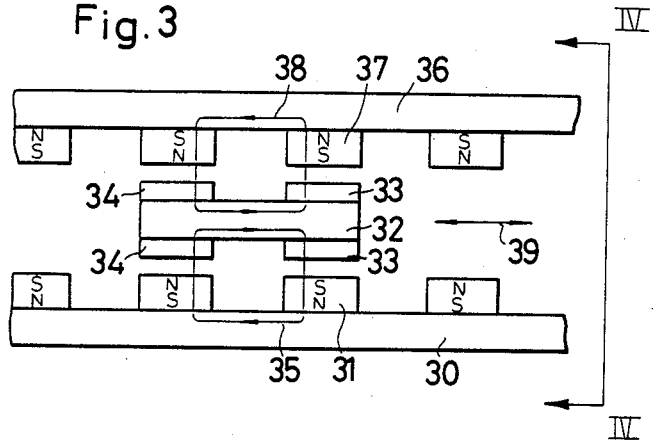
FIG. 3 is a schematic view showing a principal of interaction between the magnetic group and the coil set.

FIG. 3 is a schematic view showing the positional relationship between the coils and the magnetic fields. In this figure, reference numeral 30 designates a substrate forming a part of a magnetic path and holding permanent magnets, and reference numeral 31 designates permanent magnets which are arrayed at equal intervals in the direction of arrows 39. Reference numeral 32 designates a core of coils corresponding to the core 22, reference numerals 33 and 34 designate coils corresponding to the coils 23 and 24, respectively, and magnetic paths are closed as indicated by reference numeral 35. On the other hand, reference numerals 36 and 37 designate an additional second magnetic field forming substrate, and this magnetic substrate is disposed so that the same magnetic poles as those of the principal magnetic field forming substrate may be opposed to each other, so that the magnetic path is closed as indicated at 38. By making such provision, it becomes possible that more portions of the coils 33 and 34 contribute to the generation of the driving force. However, as a matter of course, this is not essential and there is no need to add the second magnetic field forming substrate.

Here, a force acting upon a coil when a constant current is passed through the coil will be explained with respect to the position of the coil. In the state shown in FIG. 3, the center of the coil overlaps with the center of the magnetic field, and the force obtained from the coil becomes maximum. On the other hand, if the coil is moved in the direction of the arrows 39 while a constant current is being passed through the coil, whichever direction the coil may be moved, the force obtained begins to decrease as the magnetic field penetrating through the coil is weakened, and when the coil has been moved by a distance equal to ½ of the distance between the centers of the magnetic fields, a magnetic flux penetrating through the coil becomes zero, and hence it becomes impossible to generate a force. If the coil is further moved, then it again enters the magnetic field, and a force can be generated. However, since the direction of the magnetic field is reversed, the direction of the generated force is also reversed. In this way, the force acted upon a coil when a constant current is passed through the coil depicts a curve having a period equal to the period of the array of the magnetic field in the direction of arrows 39.

Figure 4:
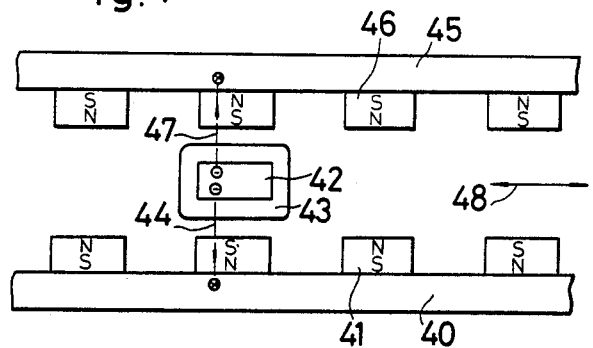
FIG. 4 is a cross-section view taken along line IV—IV in FIG. 3.

On the other hand, in FIG. 4 is shown a cross-section view taken along a plane perpendicular to the moving plane and the arrows 39 with the coil set placed at the position shown in FIG. 3. Accordingly, reference numerals 40 and 41 designate a magnetic field forming section corresponding to the magnetic field forming section 30 and 31 in FIG. 3, reference numeral 42 designates a core of coils corresponding to the core 32 in FIG. 3, reference numeral 43 designates coils corresponding to the coils 33 and 34 in FIG. 3, and reference numerals 45 and 46 designate an additional magnetic field forming section corresponding to the similar section 36 and 37 in FIG. 3. The magnetic paths 35 and 38 in FIG. 3 are represented as magnetic paths 44 and 47, respectively, in FIG. 4. Under such a condition, if the coil is moved in the directions of arrows 48, then the intensity and polarity of the magnetic field penetrating through the coil would vary with a repetition cycle equal to the period of the array of the magnetic field in the direction of the arrows 48, accordingly a force exerted upon the coil when a constant current is passed through the coil would vary with a repetition cycle equal to the period of the array of the magnetic field in the direction of the arrows 48, similarly to the variation upon movement of the coil in the direction of arrow 39 in FIG. 3.

Figure 5:
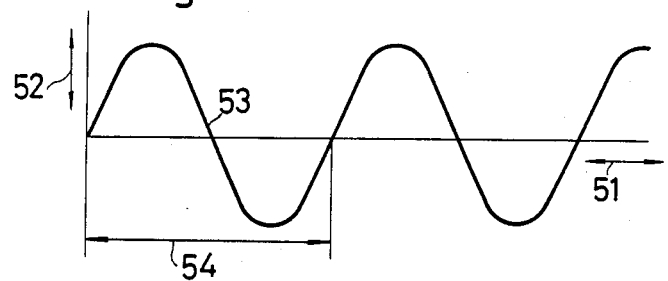
FIG. 5 is a diagram showing the relation between a position of a coil and a driving force exerted upon the coil.

One example of a force generated when a constant current is passed through the coil is shown as a function of a position of the coil relative to the magnetic field in FIG. 5. In FIG. 5, the direction of arrows 51 represents a variation of the position, and the direction of arrows 52 indicates the general force. This curve is a curve of a position versus a driving force obtained when a coil is moved in one direction of the directions of the array of the magnetic field so that the coil may pass through the magnetic field. In general, depending upon the shapes of the magnetic paths and the coil, the curve has a waveform close to a sine wave, a triangular wave or a trapezoidal wave having a period 54 equal to the period of the array of the magnetic field. This waveform has a nearly equal waveform shape having a period equal to the period of the array of the magnetic fields in the direction the coil is displaced relative to the two-dimensional array of magnetic fields. Accordingly, at any arbitrary position on the plane, the wave form, and thus the force applied to the coil, becomes a function of the position of the coil relative to the respective axial directions of the two-dimensional magnetic field array. In general it becomes a complex function with respect to position, and moreover, with a fixed repetition period there exist positions where the generated force becomes zero.

Therefore, it becomes necessary that the above-mentioned characteristics are compensated by means of a plurality of coils, and the entire coil sets are controlled in combination so as to generate a linear force with respect to an input.

In order that among a plurality of coils, a force may be generated always in at least one of the coils, it is necessary to form a coil set consisting of three or more coils, and in this specification, with respect to an example in which a set is formed of three coils and another example in which a set is formed of four coils, the coil arrays and control circuits therefor will be explained. It is to be noted that in the case where a coil set is moved only in one direction as a linear motor as described previously, two coils could be used as a coil set.

Figure 6:
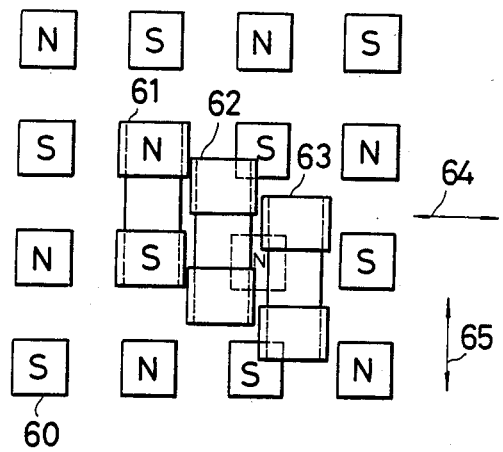
FIG. 6 is a plan view of a current-motion converter in which three coil pairs are integrally fixed to each other to be used as a coil set.

FIG. 6 illustrates one example of a coil arrangement with respect to a magnetic field in the case where six coils, that is, three pairs of coils are used as one set. Reference numerals 61, 62 and 63 designate coil pairs each of which can generate a force directed only in the direction of arrows 65. In the illustrated example, the three coil pairs are arrayed in the direction of arrows 64 with a distance between their centers equal to ⅓ of the period of array of the magnetic fields in that direction, and further they are arrayed in the direction of arrows 65 with a distance between their centers equal to 1/6 of the period of array of the magnetic fields in that direction. However, in general, an array of three coils basically consists of a coil set in which the three coils are arrayed at a distance between centers along the respective directions of arrays of the magnetic fields equal to 1/6 of the period of the array of the magnetic fields in the respective directions, and each of the coils in one set could be displaced in parallel in the respective directions of the array of the magnetic field by an arbitrary multiple of ½ of the period of the array of the magnetic fields in the respective directions. A position versus driving force curves of the three coils placed in such a positional relationship become the curves displaced in phase by ⅓ of the period from each other with respect to the respective directions of arrays of the magnetic fields, and the three curves would not become zero simultaneously. Accordingly, by regulating electric currents fed to the three coils, a force directed in the directions of arrows 65 can be obtained whatever position the coil set may be located. One example of a circuit for achieving such control is shown in FIG. 8.

Figure 8:
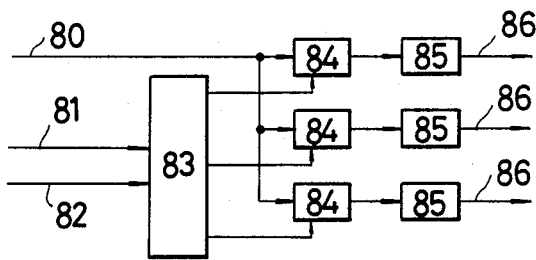
FIG. 8 is a block diagram showing one example of a control circuit for the current-motion converter shown in FIG. 6.

FIG. 8 shows a block diagram of one example of a control circuit for a current-motion converter forming a driving device according to the present invention. The purpose of this circuit is to generate a force proportional to a drive input signal 80 by making use of the three coils having the above-mentioned characteristics. The drive input signal 80 is applied to three variable amplification factor amplifiers 84. In this example, the variable amplifier 84 is a multiplier type digital-analog converter performing multiplication of algebraic signs, and the signal 80 is applied as an analog signal.

On the other hand, with reference to FIG. 8, 81 and 82 are digital signals representing the two-dimensional position of an armature. These signals are obtained from armature position detectors 104 and 105 in FIG. 10, through digital counters 106 and 107 in FIG. 10 and are inputted to a circuit 83. The circuit 83 is a current distribution signal generator circuit for generating three sets of different digital signals which determine current distribution to the three coils in response to the armature position signals 81 and 82. In the illustrated example, a read-only memory is used for the circuit 83. Three sets of different digital output from the circuit 83 are applied to the respective variable amplification factor amplifiers 84 as amplification factor control digital inputs. The input signal having its amplification factor regulated by the amplifier group 84 is converted into a current by means of a voltage-current converter group 85 and becomes three different driving current signals 86 to drive the corresponding three coils. Although the force generated by the coil set becomes a complex function of a two-dimensional position as described previously, in the control circuit according to the present invention, the generated force can be approximated finely to a necessary extent by making use of a read-only memory, and in addition in combination with a multiplier type digital-analog converter performing multiplication of algebraic signs, it becomes possible to distribute a driving current to three coils in a very simple manner.

Figure 7:
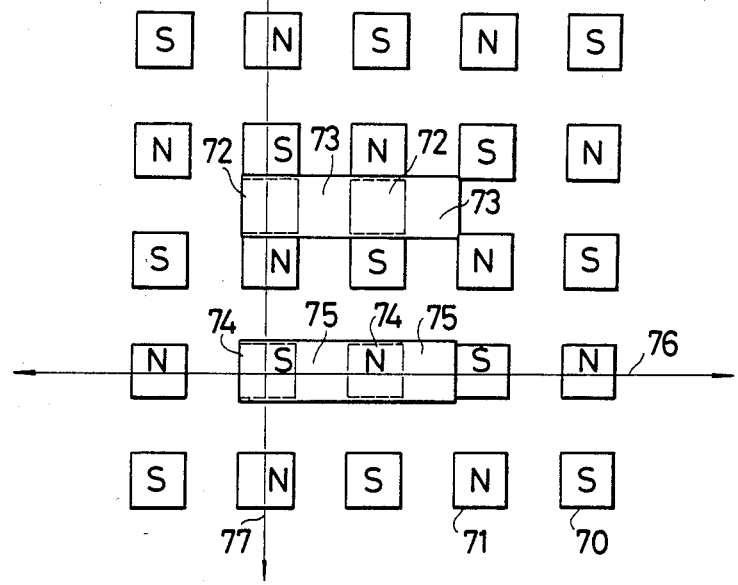
FIG. 7 is a plan view of a current-motion converter in which four coil pairs are integrally fixed to each other to be used as a coil set.

Now another example of a coil arrangement with respect to magnetic fields, in which four pairs of coils form a coil set, is shown in FIG. 7. Reference numerals 72, 73, 74 and 75 designate coil pairs having the aforementioned characteristics, and they can generate a force directed only in the directions represented by arrows 76. With reference to this figure, coil pairs 72 and 73 and coil pairs 74 and 75, respectively have magnetic path forming members in common, and the coils are wound so that one coil of one coil pair comes between the coils of another coil pair. While such shape of coil arrangement has a good space efficiency, it is not essentially necessary, and so long as the following relation of array of coils is fulfilled, the shape of the coil arrangement is not limited to the illustrated one. At first, with reference to a coil 72, a coil 73 is displaced in parallel in the direction of arrows 76 by an odd number multiple of ½ of the period of the array of the magnetic field, and a coil 74 is displaced in parallel in the directions of arrows 76 and 77 by an odd number multiple of ½ of the respective periods of the array of the magnetic field. The position versus driving force curves of the coils disposed in such manner consists of four curves having different phase relationships, which include two curves relating to one direction of the array of the magnetic field having their phases shifted by ¼ period from each other and further two curves relating to the other direction of the array of the magnetic field having their phases shifted by ¼ period from each other, and always at least one of the coils can generate a force.

Figure 9:
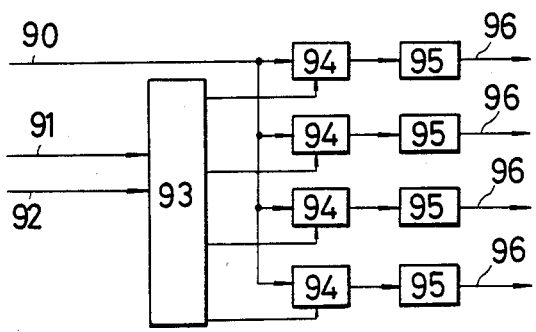
FIG. 9 is a block diagram showing one example of a control circuit for the current-motion converter shown in FIG. 7.

FIG. 9 illustrates one example of a driving circuit in the case where a coil set is formed of four coils (or four coil pairs). Reference numeral 90 designates a drive input signal, and reference numeral 94 designates a group of variable amplification factor amplifiers. Reference numerals 91 and 92 designate two-dimensional digital position signals for an armature, and reference numeral 93 designates a current distribution signal generator circuit for the four coils. Reference numeral 95 designates a group of voltage-current converters, and reference numeral 96 designates driving current signals for the respective coils. The operation principle of this circuit is similar to that explained with reference to FIG. 8. However since the number of the coil pairs is four, the phase relationship between the coil versus driving force curves is different, and hence the memory contents of the read-only memory used in the current distribution signal generator circuit are different, and the output includes four sets of wires. In addition, this driving circuit is different from that shown in FIG. 8 in that four amplifiers 94, four converters 95 and four signals 96 form respective groups for the purpose of handling four coils. Accordingly, further detailed explanation will be omitted here.

In the driving device constructed according to the present invention, the magnitude of the force generated in the coil is a function of the two-dimensional position of a coil. This is similar to the two-dimensional current-motion converter constructed according to the above-mentioned prior invention that is copending as a Japanese Patent Application No. 56344/1982 and as U.S. application Ser. No. 481,324, filed Apr. 1, 1983 entitled Two-Dimensional Precise Positioning Device for Use in a Semiconductor Manufacturing Apparatus. However since in the present case the direction of the generated force is unidirectional the control of the device is easier and a force having fully predetermined magnitude and direction can be generated without relying upon a high manufacturing precision of the device.

While description of a driving device according to the present invention has been finished, it is a matter of course that the method for forming or establishing the magnetic fields and the shape and combination of the coils can be arbitrarily varied without departing form the spirit of the present invention.

What is claimed is:
1. A current-motion converter is provided comprising:
   a magnetic field group formed from a plurality of magnetic fields disposed on a plane in a two-dimensional array with an equal predetermined distance between the centers of the magnetic fields with respect to the two dimensions of the array, the magnetic fields of the array being disposed perpendicular to the plane and adjacent magnetic fields being directed in alternate directions;

a first coil set adapted to generate a force in one direction of said two-dimensional magnetic field group, said first coil set being formed by fixedly securing a plurality of coils to each other;

a second coil set adapted to generate a force in the other two-dimensional direction different from said one direction, said second coil set being formed by fixedly securing a plurality of coils to each other;

each coil of said coil sets being generally rectangular in shape, the side dimensions of said rectangular coils being generally parallel to the two-dimensions of said magnetic field group, the sides of the coils extending approximately one-half of said predetermined distance between the centers of the fields of said magnetic field group, and the coils of said coil sets being provided with a predetermined spacing approximately equal to said predetermined distance of the two-dimensions of said magnetic field group;

a coil group formed by fixedly securing said coil sets to each other, said coil group being disposed within said magnetic field group so as to be freely movable along said plane;

a detector device for registering a position of an armature in said converter;

a current distribution signal generator device responsive to a value applied to said current distribution signal generator device by said detector device; and a group of amplifiers having amplification factors controlled by said current distribution signal generator device.

2. A current-motion converter is provided comprising:

a magnetic field group formed from a plurality of magnetic fields disposed in a linear one-dimensional array with an equal predetermined distance between the centers of the magnetic fields, the magnetic fields of the array being disposed perpendicular to the plane and adjacent magnetic fields being directed in alternate directions;

a coil set adapted to generate a force directed in the direction of said linear array of magnetic fields, said coil set being formed by fixedly securing a plurality of coils to each other, each coil of said coil set being generally rectangular in shape, the side dimensions of said rectangular coils being generally parallel to said linear array of magnetic fields, the sides of the coils extending approximately one-half of said predetermined distance between the centers of the fields of said magnetic field group, and the coils of said coil set being provided with a predetermined spacing approximately equal to said predetermined distance of said magnetic field group;

said coil set being disposed so as to be freely movable along said magnetic field;

a detector device for registering a position of an armature in said converter;

a current distribution signal generator device responsive to a value applied to said current distribution signal generator device by said detector device; and a group of amplifiers having amplification factors controlled by said current distribution signal generator device.

3. A current-motion converter as claimed in claim 1 or 2 characterized in that each coil set comprises at least three coils adapted to generate driving forces having different phases.

4. A current-motion converter as claimed in claims 1 or 2, characterized in that each coil set comprises at least four coils adapted to generate driving forces having different phases.

5. A driving device as claimed in claim 1 or 2, characterized in that said current distribution signal generator device is an electronic computer.

* * * * *